United States Patent
Prechtl et al.

(10) Patent No.: US 9,837,522 B2
(45) Date of Patent: Dec. 5, 2017

(54) III-NITRIDE BIDIRECTIONAL DEVICE

(71) Applicant: Infineon Technologies Austria AG, Villach (AT)

(72) Inventors: Gerhard Prechtl, Rosegg (AT); Clemens Ostermaier, Villach (AT); Oliver Haeberlen, Villach (AT)

(73) Assignee: Infineon Technologies Austria AG, Villach (AT)

(*) Notice: Subject to any disclaimer, the term of this patent is extended or adjusted under 35 U.S.C. 154(b) by 9 days.

(21) Appl. No.: 14/929,856

(22) Filed: Nov. 2, 2015

(65) Prior Publication Data
US 2017/0125562 A1 May 4, 2017

(51) Int. Cl.
*H01L 29/778* (2006.01)
*H01L 29/20* (2006.01)
*H01L 29/205* (2006.01)
*H01L 29/423* (2006.01)
*H01L 29/10* (2006.01)

(52) U.S. Cl.
CPC ...... *H01L 29/7787* (2013.01); *H01L 29/1029* (2013.01); *H01L 29/2003* (2013.01); *H01L 29/205* (2013.01); *H01L 29/42312* (2013.01); *H01L 29/42316* (2013.01); *H01L 29/7783* (2013.01); *H01L 29/1066* (2013.01)

(58) Field of Classification Search
USPC .................................................. 257/76, 194
See application file for complete search history.

(56) References Cited

U.S. PATENT DOCUMENTS

| | | | |
|---|---|---|---|
| 5,801,417 A | 9/1998 | Tsang | |
| 2009/0065810 A1* | 3/2009 | Honea | H01L 27/0605 257/192 |
| 2009/0267078 A1* | 10/2009 | Mishra | H01L 29/2003 257/76 |
| 2010/0321363 A1* | 12/2010 | Morita | G09G 3/2965 345/211 |

OTHER PUBLICATIONS

Morita T. et al., 650 V 3.1 mOcm2 GaN-based monolithic bidirectional switch using normally-off gate injection transistor, Electron Devices Meeting, IEDM. IEEE International (20007).

* cited by examiner

*Primary Examiner* — Marcos D Pizarro
*Assistant Examiner* — Lawrence Tynes, Jr.
(74) *Attorney, Agent, or Firm* — Murphy, Bilak & Homiller, PLLC

(57) ABSTRACT

There are disclosed herein various implementations of a III-Nitride bidirectional device. Such a bidirectional device includes a substrate, a back channel layer situated over the substrate, and a device channel layer and a device barrier layer situated over the back channel layer. The device channel layer and the device barrier layer are configured to produce a device two-dimensional electron gas (2DEG). In addition, the III-Nitride bidirectional device includes first and second gates formed on respective first and second depletion segments situated over the device barrier layer. The III-Nitride bidirectional device also includes a back barrier situated between the back channel layer and the device channel layer. A polarization of the back channel layer of the III-Nitride bidirectional device is substantially equal to a polarization of the device channel layer.

22 Claims, 8 Drawing Sheets

III-NITRIDE BIDIRECTIONAL DEVICE

BACKGROUND

I. Definition

As used herein, the phrase "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1,200V), or higher.

II. Background Art

III-Nitride semiconductor devices, such as gallium nitride (GaN) based transistors, are devices that can operate using polarization fields to generate a two-dimensional electron gas (2DEG) allowing for high current densities with low resistive losses. As a result, III-Nitride semiconductor devices, such as depletion mode (i.e., normally on) high electron mobility transistors (HEMTs), are used in many power applications.

However, in some power management applications, normally off characteristics of power devices may be desirable. For example, enhancement mode (i.e., normally off) III-Nitride bidirectional transistors may be advantageous for use in a matrix converter. In such cases, a normally off III-Nitride bidirectional transistor having desirable on-state characteristics can be implemented through the introduction of features that deplete the 2DEG under each of the two transistor gates. Unfortunately, some conventional techniques for producing a normally off III-Nitride bidirectional transistor can result in substantial power loss due to leakage current between the two gates when the bidirectional transistor is off.

SUMMARY

The present disclosure is directed to a III-Nitride bidirectional device, substantially as shown in and/or described in connection with at least one of the figures, and as set forth in the claims.

DETAILED DESCRIPTION

Figure 1:
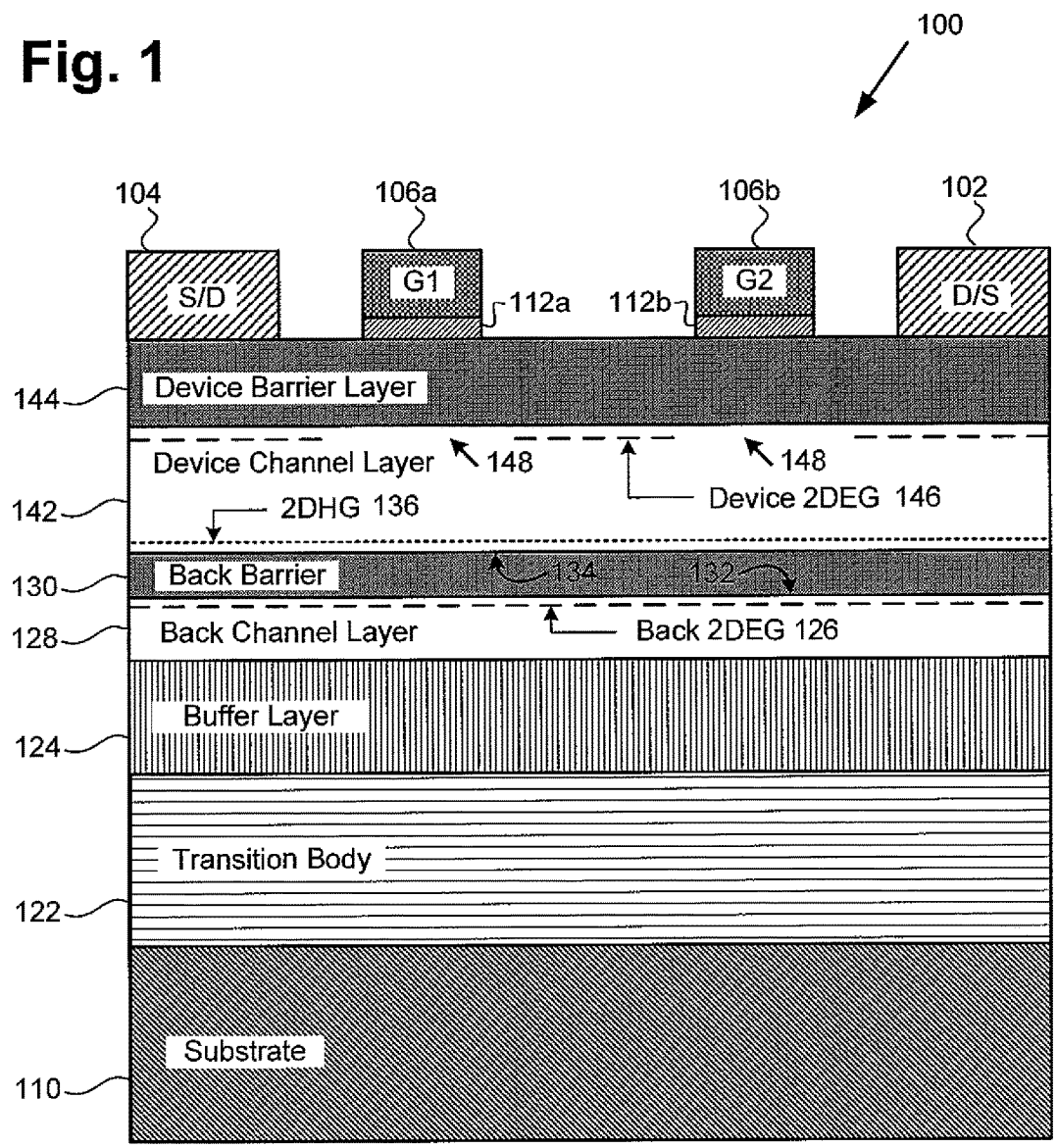
FIG. 1 shows a cross-sectional view of an exemplary III-Nitride bidirectional device, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, III-Nitride semiconductor devices, such as gallium nitride (GaN) based transistors, are devices that can operate using polarization fields to generate a two-dimensional electron gas (2DEG) allowing for high current densities with low resistive losses. As a result GaN or other III-Nitride semiconductor based transistors may advantageously be utilized as high voltage (HV) bidirectional devices. Moreover, in power management applications in which normally off characteristics of power devices may be desirable, an enhancement mode (i.e., normally off) III-Nitride bidirectional transistor having desirable on-state characteristics can be implemented through the introduction of features that deplete the 2DEG under each of the two transistor gates. However, and as further noted above, some conventional techniques for producing a normally off III-Nitride bidirectional transistor can result in substantial power loss due to leakage current between the two gates when the bidirectional transistor is off.

The present application is directed to III-Nitride bidirectional devices configured such that leakage current between the bidirectional transistor gates during the off-state is significantly reduced or substantially eliminated. Consequently, power losses in the III-Nitride bidirectional devices disclosed in the present application, during their off-state, may be substantially minimized. According to various implementations of the present inventive concepts, a back barrier overlies a back channel layer formed in the structure providing the III-Nitride bidirectional device. The back channel layer is configured to have a polarization substantially equal to a polarization of a device channel layer overlying the back barrier. In one implementation, the back barrier may generate a back 2DEG in the back channel layer, as well as a two-dimensional hole gas (2DHG) in the device channel layer.

FIG. 1 shows a cross-sectional view of exemplary III-Nitride bidirectional device 100 including such a back barrier, according to one implementation. As shown in FIG. 1, III-Nitride bidirectional device 100 includes substrate 110, as well as transition body 122, buffer layer 124, and back channel layer 128 all situated over substrate 110. In addition, FIG. 1 shows device channel layer 142 situated over back channel layer 128, and device barrier layer 144 situated over device channel layer 142 to produce device 2DEG 146.

FIG. 1 also shows back barrier 130 having bottom surface 132 and top surface 134, and being situated between back channel layer 128 and device channel layer 142. Back channel layer 128 is configured to have a polarization substantially equal to a polarization of device channel layer 142. Moreover, according to the exemplary implementation shown in FIG. 1, back barrier 130 is configured to produce back 2DEG 126 in back channel layer 128 and to produce 2DHG 136 in device channel layer 142, below device 2DEG 146.

III-Nitride bidirectional device 100 further includes drain/source electrode 102, source/drain electrode 104, and first and second gates 106a and 106b situated between drain/source electrode 102 and source/drain electrode 104. As also shown in FIG. 1, first and second gates 106a and 106b are formed on respective first and second depletion segments 112a and 112b situated over device barrier layer 144. It is noted that, although each of drain/source electrode 102 and source/drain electrode 104 may serve alternatively as the drain or source contact for III-Nitride bidirectional device 100, for the purposes of the present disclosure, drain/source electrode 102 and second gate 106b are at drain potential, and source/drain electrode 104 and first gate 106a are at source potential, when III-Nitride bidirectional device 100 is off.

Drain/source electrode 102 and source/drain electrode 104 are configured such that they make ohmic contact with device 2DEG 146. In addition, according to the implementation shown in FIG. 1, first and second gates 106a and 106b make ohmic contact with respective first and second depletion segments 112a and 112b. First and second gates 106a and 106b may be metal gates, and may be implemented as a metal gate stack, such as a titanium-aluminum-titanium (Ti—Al—Ti) gate stack, for example.

First and second depletion segments 112a and 112b may take the form of P type III-Nitride segments, such as segments formed of P type GaN, for example. First and second depletion segments 112a and 112b are configured to deplete device 2DEG 146 under respective first and second gates 106a and 106b. As a result, and as shown by interruptions 148 in device 2DEG 146 under first and second gates 106a and 106b, according to the present exemplary implementation, III-Nitride bidirectional device 100 is an enhancement mode (normally off) bidirectional transistor.

It is noted that in some implementations, III-Nitride bidirectional device 100 may be a high voltage (HV) device, as described above in the "Definition" section. For example, III-Nitride bidirectional device 100 may be a six hundred volt (600V) device configured to sustain a potential difference of approximately 600V between first and second gates 106a and 106b.

Substrate 110 may be formed of any commonly utilized substrate material. For example, substrate 110 may be formed of sapphire, may be a native III-Nitride substrate, or may be a group IV substrate as described above in the "Definition" section. Transition body 122 may be formed of multiple III-Nitride layers situated over substrate 110. In some implementations, transition body 122 may take the form of a III-Nitride body including compositionally graded layers and having different III-Nitride alloy compositions at respective top and bottom surfaces.

Although not shown in FIG. 1, in some implementations, III-Nitride bidirectional device 100 may also include a strain-absorbing layer formed between substrate 110 and transition body 122. Such a strain-absorbing layer may be an amorphous strain-absorbing layer, for example, an amorphous silicon nitride layer. It is noted that in implementations in which substrate 110 is a non-native substrate for device channel layer 142 and device barrier layer 144 (i.e., a non III-Nitride substrate, such as a silicon or other group IV substrate), transition body 122 is provided to mediate the lattice transition from substrate 110 to buffer layer 124.

In one implementation, transition body 122 may include a nucleation layer (nucleation layer not shown in FIG. 1), in addition to layers formed so as to reduce the net mismatch in thermal coefficient of expansion between substrate 110 and later formed III-Nitride active layers, such as device channel layer 142 and device barrier layer 144. For instance, when forming a GaN based III-Nitride bidirectional device, transition body 122 may include an aluminum nitride (AlN) layer formed on substrate 110, or on a strain-absorbing layer and/or a nucleation layer formed on substrate 110, and may further include a series of intermediate layers, such as aluminum gallium nitride (AlGaN) layers having a progressively reduced or otherwise varied aluminum content relative to their gallium content, until a suitable transition to buffer layer 124 is achieved.

Buffer layer 124 is situated over transition body 122 and may be an electrically insulating III-Nitride material layer formed using any of a number of known growth techniques. Buffer layer 124 may be formed using any suitable technique for forming III-Nitride based layers, such as molecular-beam epitaxy (MBE), metalorganic chemical vapor deposition (MOCVD), or hydride vapor phase epitaxy (HVPE), to name a few suitable approaches. It is noted that any of MBE, MOCVD, or HVPE, for example, may also be used to form transition body 122.

Back channel layer 128 is situated over transition body 122, on electrically insulating buffer layer 124, and may be a III-Nitride material layer. For example, in implementations in which III-Nitride bidirectional device 100 is a GaN based HEMT, back channel layer may be a GaN layer from which aluminum is substantially absent. More generally, however, back channel layer 128 and device channel layer 142 may be implemented as GaN based layers having similar or substantially equal aluminum concentrations in a range from approximately zero percent to approximately five percent aluminum (i.e., less than or equal to approximately 5% Al). Like transition body 122 and buffer layer 124, back channel layer 128 may be formed using any suitable technique for forming III-Nitride based layers, such as MBE, MOCVD, or HVPE, for example.

Device channel layer 142 is formed over back channel layer 128, and device barrier layer 144 is formed over device channel layer 142 using any of MBE, MOCVD, or HYPE, for example. In addition a thin III-Nitride capping layer may be used over device barrier layer 144 (capping layer not shown in FIG. 1). In one implementation, for example, III-Nitride bidirectional device 100 may take the form of a III-Nitride HEMT having a GaN layer as device channel layer 142 and an AlGaN layer as device barrier layer 144. It is noted that, in some implementations, the optional capping layer described above may be formed of GaN or AlGaN and may be intentionally doped or may be substantially undoped. However, in other implementations, the optional capping layer may be formed of an insulating material, such as silicon nitride ($Si_3N_4$), for example.

It is further noted that in some implementations, it may be advantageous or desirable to form device barrier layer 144 over a spacer layer (or layers) disposed between device barrier layer 144 and device channel layer 142 (spacer layer or layers also not shown in FIG. 1). It is also noted that the discussion above regarding substrate 110, transition body 122, buffer layer 124, back channel layer 128, device channel layer 142, and device barrier layer 144 applies respectively to the substrate, transition body, buffer layer, back channel layer, device channel layer, and device barrier layer discussed in relation to FIG. 2 below.

As also shown in FIG. 1, back barrier 130 is situated between back channel layer 128 and device channel layer 142, and in the exemplary implementation of FIG. 1 produces back 2DEG 126 in back channel layer 128 and 2DHG 136 in device channel layer 142. Back barrier layer 130 may be formed of any III-Nitride material or materials suitable for producing back 2DEG 126 and 2DHG 136. For example, back barrier layer 130 may be formed of a III-Nitride material having a larger bandgap than back channel layer 128, as well as a larger bandgap than device channel layer 142. However, in other implementations, back barrier layer 130 may be formed of a III-Nitride material having a smaller bandgap than back channel layer 128, as well as a smaller bandgap than device channel layer 142.

As a specific example in which back barrier 130 has a larger bandgap than back channel layer 128 and device channel layer 142, back channel layer 128 and device channel layer 142 may be implemented as GaN layers, while back barrier 130 may be formed of AlGaN. Moreover, and as discussed in greater detail below by reference to FIGS. 3A, 3B, 3C, 3D, 4A, and 4B, back barrier 130 may include multiple III-Nitride layers, such as AlGaN layers, where adjoining layers of back barrier 130 have different respective aluminum concentrations. Back barrier 130 may be formed using any of MBE, MOCVD, or HYPE, for example.

Figure 2:
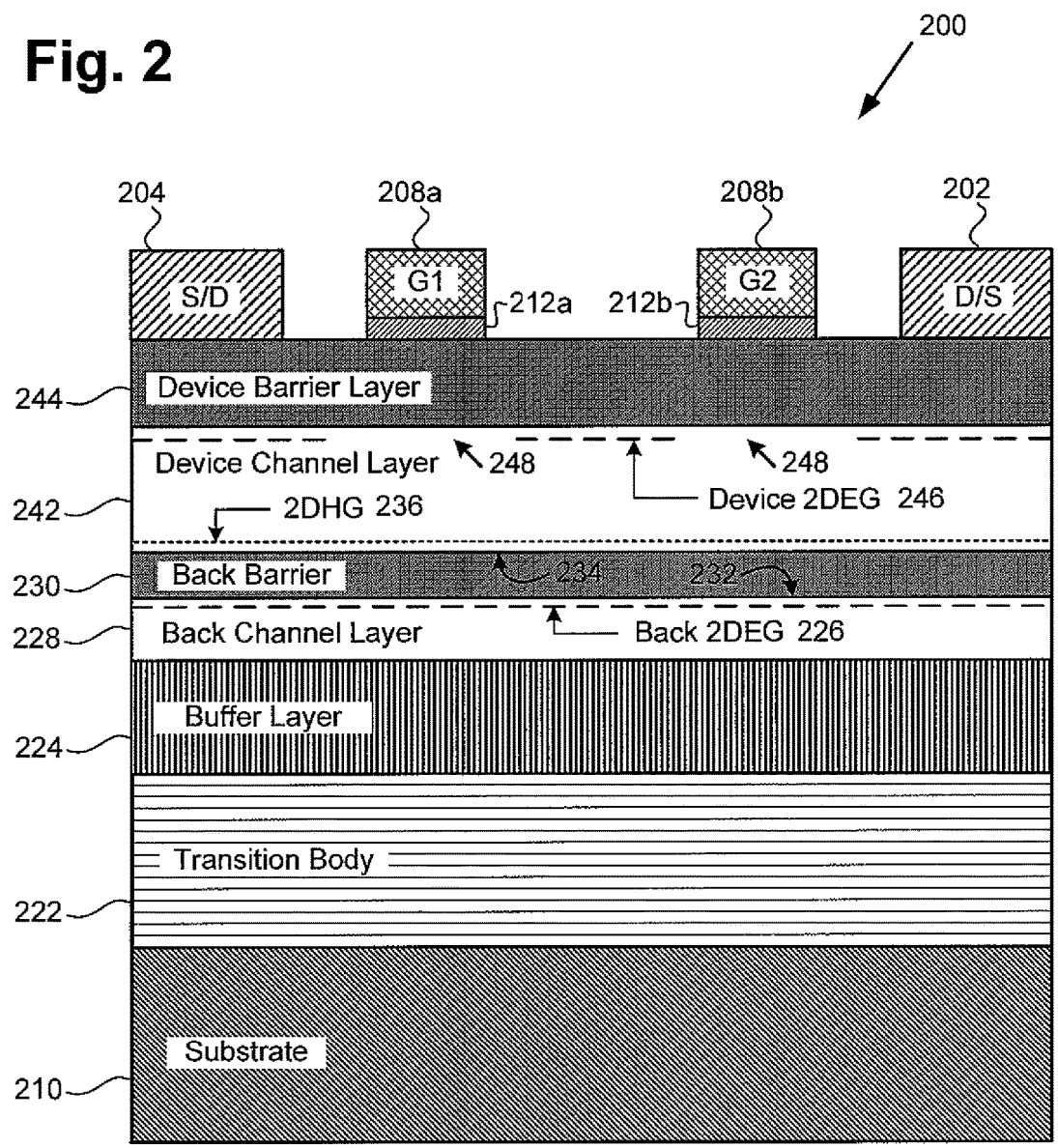
FIG. 2 shows a cross-sectional view of an exemplary III-Nitride bidirectional device, according to another implementation.

Referring to FIG. 2, FIG. 2 shows a cross-sectional view of exemplary III-Nitride bidirectional device 200 including a back barrier, according to another implementation. As shown in FIG. 2, III-Nitride bidirectional device 200 includes substrate 210, as well as transition body 222, buffer layer 224, and back channel layer 228 all situated over substrate 210. In addition, FIG. 2 shows device channel layer 242 situated over back channel layer 228, and device barrier layer 244 situated over device channel layer 242 to produce device 2DEG 246.

FIG. 2 also shows back barrier 230 having bottom surface 232 and top surface 234, and being situated between back channel layer 228 and device channel layer 242. Back channel layer 228 is configured to have a polarization substantially equal to a polarization of device channel layer 242. Moreover, according to the exemplary implementation shown in FIG. 2, back barrier 230 is configured to produce back 2DEG 226 in back channel layer 228 and to produce 2DHG 236 in device channel layer 242, below device 2DEG 246. III-Nitride bidirectional device 200 further includes drain/source electrode 202, source/drain electrode 204, and first and second gates 208a and 208b formed on respective first and second depletion segments 212a and 212b situated between drain/source electrode 202 and source/drain electrode 204.

Substrate 210, transition body 222, buffer layer 224, back channel layer 228, and back 2DEG 226 correspond in general to substrate 110, transition body 122, buffer layer 124, back channel layer 128, and back 2DEG 126, respectively, in FIG. 1, and may share any of the characteristics attributed to those corresponding features, above. In addition, back barrier 230, device channel layer 242, device barrier layer 244, device 2DEG 246, and 2DHG 236, in FIG. 2, correspond in general to back barrier 130, device channel layer 142, device barrier layer 144, device 2DEG 146, and 2DHG 136, respectively, in FIG. 1, and may analogously share any of the characteristics attributed to those corresponding features, above. Moreover, drain/source electrode 202, source/drain electrode 204, and first and second depletion segments 212a and 212b, in FIG. 2, correspond in general to drain/source electrode 102, source/drain electrode 104, and first and second depletion segments, respectively, in FIG. 1, and may share any of the characteristics attributed to those corresponding features, above.

By analogy to the implementation shown in FIG. 1, first and second depletion segments 212a and 212b are configured to deplete device 2DEG 246 under respective first and second gates 208a and 208b. As a result, and as shown by interruptions 248 in device 2DEG 246 under first and second gates 208a and 208b, according to the present exemplary implementation, III-Nitride bidirectional device 200 is an enhancement mode (normally off) bidirectional transistor. In contrast to the implementation shown in FIG. 1, however, first and second gates 208a and 208b, in FIG. 2, make Schottky contact with respective first and second depletion segments 212a and 212b. First and second gates 208a and 208b may be metal gates, and may be implemented using any suitable Schottky metal.

It is noted that although the present application shows and expressly describes first and second gates 106a/208a and 106b/208b as making ohmic/Schottky contact with first and second depletion segments 112a/212a and 112b/212b, those implementations are merely exemplary. The present inventive concepts are generally applicable regardless of the nature of the electrical coupling between first and second gates 106a/208a and 106b/208b and respective first and second depletion segments 112a/212a and 112b/212b. Thus, in some implementations, first and second gates corresponding respectively to first and second gates 106a/208a and 106b/208b may take the form of isolated gates, as known in the art.

It is further noted that, like III-Nitride bidirectional device 100, in FIG. 1, in some implementations, III-Nitride bidirectional device 200, in FIG. 2, may be an HV device, as described above in the "Definition" section. For example, III-Nitride bidirectional device 200 may be a 600V device configured to sustain a potential difference of approximately 600V between first and second gates 208a and 208b.

According to the exemplary implementations shown in FIGS. 1 and 2, back 2DEG 126/226 and 2DHG 136/236 can effectively neutralize one another when III-Nitride bidirectional device 100/200 is off so as to reduce or substantially eliminate leakage current between first and second gates 106a/208a and 106b/208b in the off-state, even at high drain voltages.

Figure 3A:
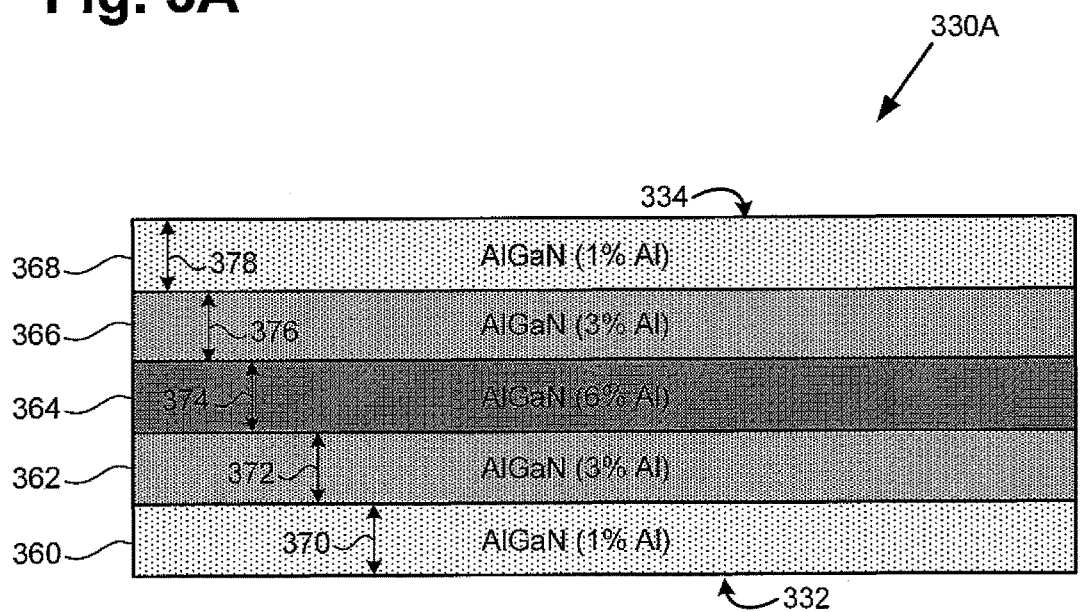
FIG. 3A shows a cross-sectional view of an exemplary back barrier suitable for use in the III-Nitride bidirectional devices of FIG. 1 and FIG. 2, according to one implementation.

Referring to FIG. 3A, FIG. 3A shows a cross-sectional view of an exemplary back barrier suitable for use in the III-Nitride bidirectional devices of FIGS. 1 and 2, according to one implementation. As shown in FIG. 3A, back barrier 330A includes multiple III-Nitride layers in the form of AlGaN layers including bottom layer 360 having thickness 370, layer 362 having thickness 372, middle layer 364 having thickness 374, layer 366 having thickness 376, and top layer 368 having thickness 378. As further shown in FIG. 3A, back barrier 330A has bottom surface 332 provided by bottom layer 360, and top surface 334 provided by top layer 368. Back barrier 330A having bottom surface 332 and top surface 334 corresponds in general to back barrier 130/230 having bottom surface 132/232 and top surface 134/234 in FIG. 1/2, and may share any of the characteristics attributed to that corresponding feature in the present application.

According to the implementation shown in FIG. 3A, adjoining layers of back barrier 330A have different respective aluminum concentrations. However, thicknesses 370, 372, 374, 376, and 378 may be substantially the same. In addition, according to the present implementation, the aluminum concentration at top surface 334 (i.e., approximately 1%) is substantially equal to the aluminum concentration at bottom surface 332 (i.e., approximately 1%).

Middle layer 364 of back barrier 330A is shown to have the highest aluminum concentration (i.e., approximately 6%) among III-Nitride layers 360, 362, 364, 366, and 368. Moreover the aluminum concentration of back barrier 330A is shown to be stepped up between bottom layer 360 and middle layer 364 by layer 362 (approximately 3% Al), and to be correspondingly stepped down between middle layer 364 and top layer 368 by layer 366 (approximately 3% Al).

It is noted that although back barrier 330A is shown as a stack of discrete layers, which may form a superlattice, for example, in other implementations, back barrier 330A may be implemented as a graded III-Nitride layer having an alloy distribution corresponding to that shown in FIG. 3A. Moreover, the distribution of III-Nitride alloys in back barrier 330A may form a Gaussian style symmetric distribution, or a smooth or piecewise-continuous asymmetric distribution between the alloy used to form bottom layer 360 and the alloy used to form top layer 368.

Figure 3B:
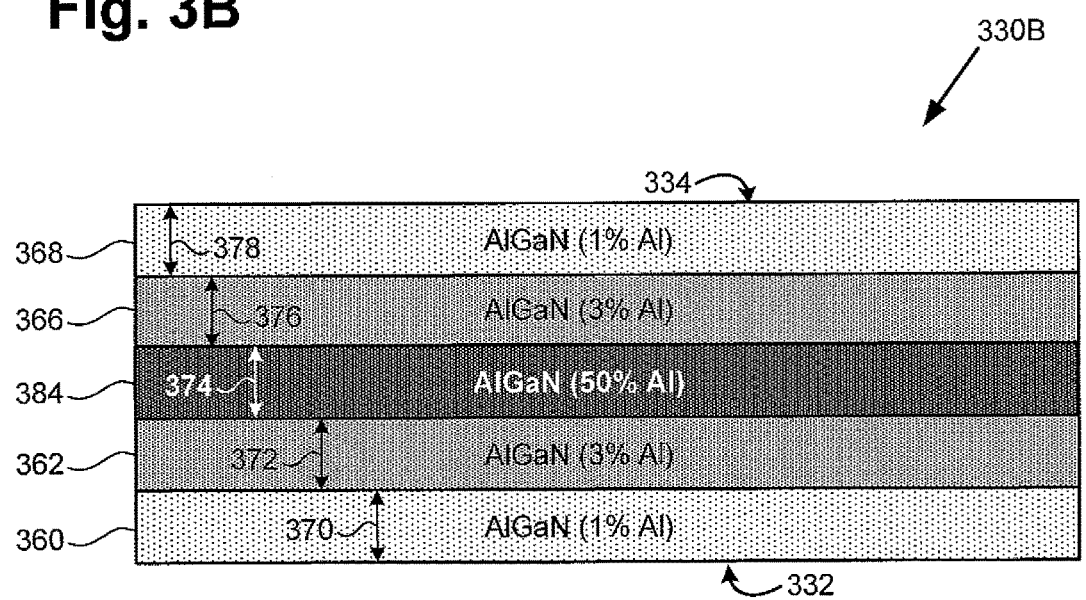
FIG. 3B shows a cross-sectional view of an exemplary back barrier suitable for use in the III-Nitride bidirectional devices of FIG. 1 and FIG. 2, according to another implementation.

Continuing to FIG. 3B, FIG. 3B shows a cross-sectional view of an exemplary back barrier suitable for use in the III-Nitride bidirectional devices of FIGS. 1 and 2, according to another implementation. It is noted that the features in FIG. 3B identified by reference numbers identical to those appearing in FIG. 3A correspond respectively to those features, as described above, and may share any of the characteristics attributed to those corresponding features, above. It is further noted that back barrier 330B having bottom surface 332 and top surface 334 corresponds in general to back barrier 130/230 having bottom surface 132/232 and top surface 134/234 in FIG. 1/2, and may share any of the characteristics attributed to that corresponding feature in the present application.

As shown in FIG. 3B, back barrier 330B differs from back barrier 330A, in FIG. 3A, in that the implementation in FIG. 3B includes middle layer 384 having a substantially higher aluminum concentration (i.e., approximately 50%) than middle layer 364. It is noted that although back barrier 330B is shown as a stack of discrete layers, which may form a superlattice, for example, in other implementations, back barrier 330B may be implemented as a graded III-Nitride layer having an alloy distribution corresponding to that shown in FIG. 3B. Moreover, and as further noted above by reference to back barrier 330A, in FIG. 3A, the distribution of III-Nitride alloys in back barrier 330B may form a Gaussian style symmetric distribution, or a smooth or piecewise-continuous asymmetric distribution between the alloy used to form bottom layer 360 and the alloy used to form top layer 368.

Figure 3C:
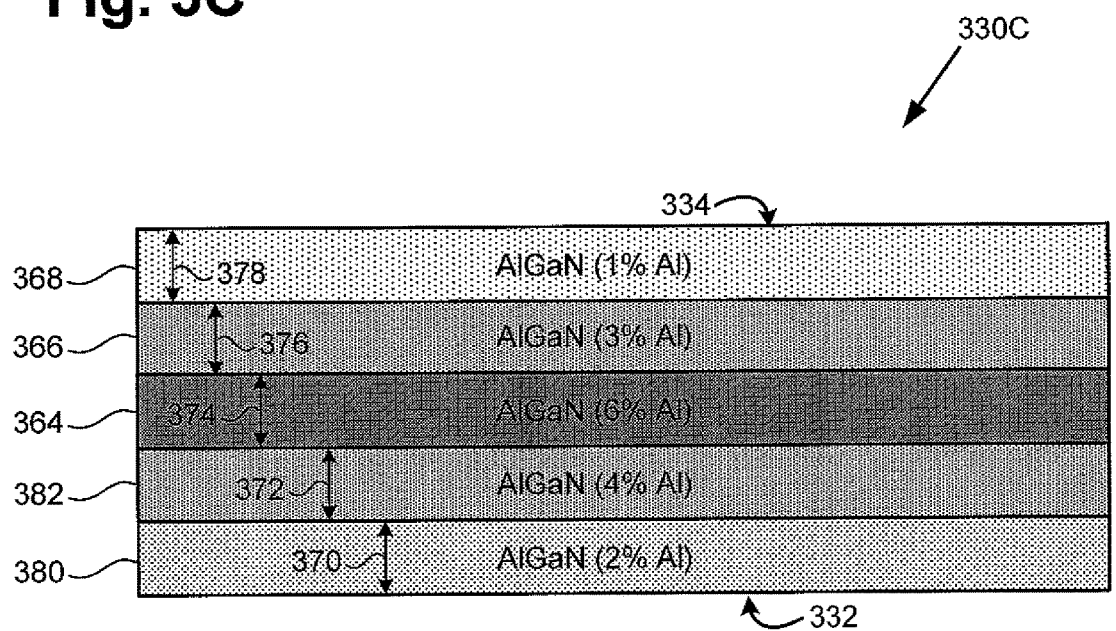
FIG. 3C shows a cross-sectional view of an exemplary back barrier suitable for use in the III-Nitride bidirectional devices of FIG. 1 and FIG. 2, according to another implementation.

Moving to FIG. 3C, FIG. 3C shows a cross-sectional view of an exemplary back barrier suitable for use in the III-Nitride bidirectional devices of FIGS. 1 and 2, according to another implementation. It is noted that the features in FIG. 3C identified by reference numbers identical to those appearing in FIG. 3A correspond respectively to those features, as described above, and may share any of the characteristics attributed to those corresponding features, above. It is further noted that back barrier 330C having bottom surface 332 and top surface 334 corresponds in general to back barrier 130/230 to having bottom surface 132/232 and top surface 134/234 in FIG. 1/2, and may share any of the characteristics attributed to that corresponding feature in the present application.

As shown in FIG. 3C, back barrier 330C differs from back barrier 330A, in FIG. 3A, in that the aluminum concentration at top surface 334 (i.e., approximately 1%) is less than the aluminum concentration at bottom surface 332 (i.e., approximately 2%). Moreover, in contrast to back barrier 330A, the aluminum concentration of back barrier 330A is shown to be stepped up between bottom layer 380 and middle layer 364 by layer 382 (approximately 4% Al). It is noted that although back barrier 330C is shown as a stack of discrete layers, which may form a superlattice, for example, in other implementations, back barrier 330C may be implemented as a graded III-Nitride layer having an alloy distribution corresponding to that shown in FIG. 3C. Moreover, the distribution of III-Nitride alloys in back barrier 330C may form a Gaussian style symmetric distribution, or a smooth or piecewise-continuous asymmetric distribution between the alloy used to form bottom layer 380 and the alloy used to form top layer 368.

Figure 3D:
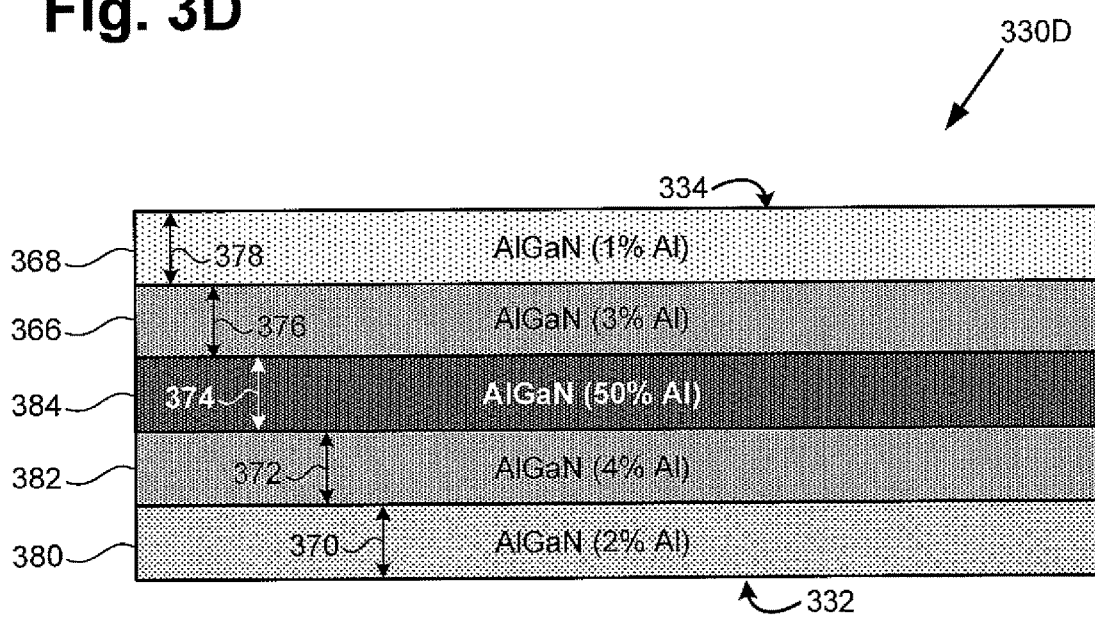
FIG. 3D shows a cross-sectional view of an exemplary back barrier suitable for use in the III-Nitride bidirectional devices of FIG. 1 and FIG. 2, according to another implementation.

Continuing to FIG. 3D, FIG. 3D shows a cross-sectional view of an exemplary back barrier suitable for use in the III-Nitride bidirectional devices of FIGS. 1 and 2, according to another implementation. It is noted that the features in FIG. 3D identified by reference numbers identical to those appearing in FIGS. 3A and 3C correspond respectively to those features, as described above, and may share any of the characteristics attributed to those corresponding features, above. It is further noted that back barrier 330D having bottom surface 332 and top surface 334 corresponds in general to back barrier 130/230 having bottom surface 132/232 and top surface 134/234 in FIG. 1/2, and may share any of the characteristics attributed to that corresponding feature in the present application.

As shown in FIG. 3D, back barrier 330D differs from back barrier 330C, in FIG. 3C, in that the implementation in FIG. 3D includes middle layer 384 having a substantially higher aluminum concentration (i.e., approximately 50%) than middle layer 364. It is noted that although back barrier 330D is shown as a stack of discrete layers, which may form a superlattice, for example, in other implementations, back barrier 330D may be implemented as a graded III-Nitride layer having an alloy distribution corresponding to that shown in FIG. 3D. Moreover, and as further noted above by reference to back barrier 330C, in FIG. 3C, the distribution of III-Nitride alloys in back barrier 330D may form a Gaussian style symmetric distribution, or a smooth or piecewise-continuous asymmetric distribution between the alloy used to form bottom layer 380 and the alloy used to form top layer 368.

Figure 3E:
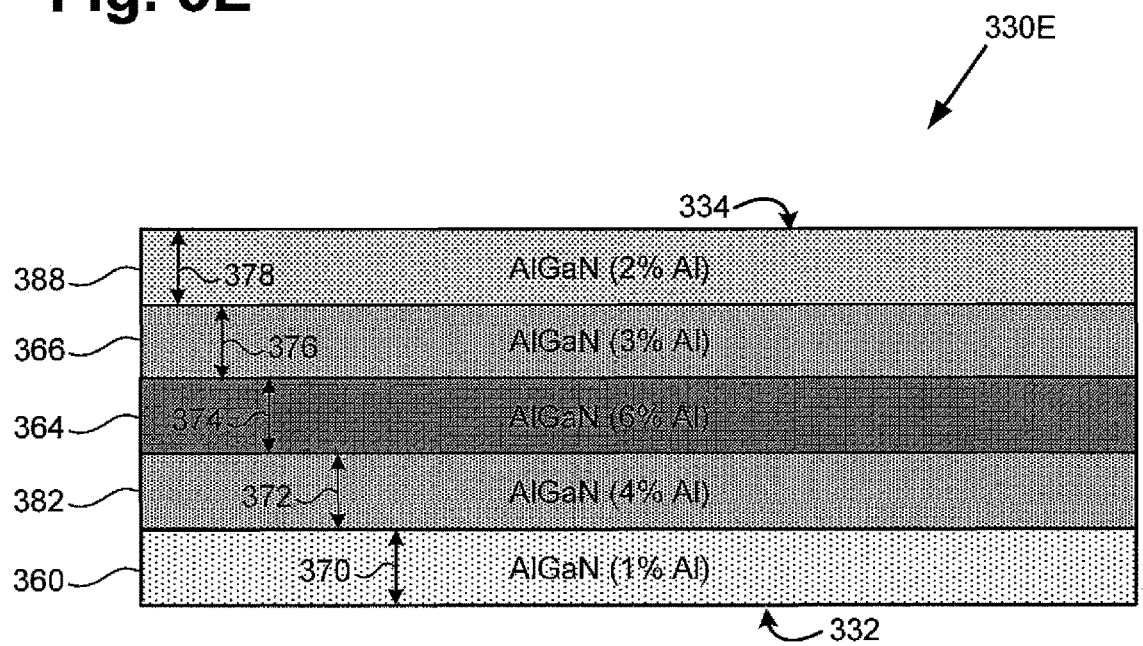
FIG. 3E shows a cross-sectional view of an exemplary back barrier suitable for use in the III-Nitride bidirectional devices of FIG. 1 and FIG. 2, according to another implementation.

Referring to FIG. 3E, FIG. 3E shows a cross-sectional view of an exemplary back barrier suitable for use in the III-Nitride bidirectional devices of FIGS. 1 and 2, according to another implementation. It is noted that the features in FIG. 3E identified by reference numbers identical to those appearing in FIGS. 3A and 3C correspond respectively to those features, as described above, and may share any of the characteristics attributed to those corresponding features, above. It is further noted that back barrier 330E having bottom surface 332 and top surface 334 corresponds in general to back barrier 130/230 having bottom surface 132/232 and top surface 134/234 in FIG. 1/2, and may share any of the characteristics attributed to that corresponding feature in the present application.

As shown in FIG. 3E, back barrier 330E has an aluminum concentration at top surface 334 (i.e., approximately 2%) that is greater than the aluminum concentration at bottom surface 332 (i.e., approximately 1%). It is noted that although back barrier 330E is shown as a stack of discrete layers, which may form a superlattice, for example, in other implementations, back barrier 330E may be implemented as a graded III-Nitride layer having an alloy distribution corresponding to that shown in FIG. 3E. Moreover, the distribution of III-Nitride alloys in back barrier 330E may form a Gaussian style symmetric distribution, or a smooth or piecewise-continuous asymmetric distribution between the alloy used to form bottom layer 360 and the alloy used to form top layer 388.

Figure 3F:
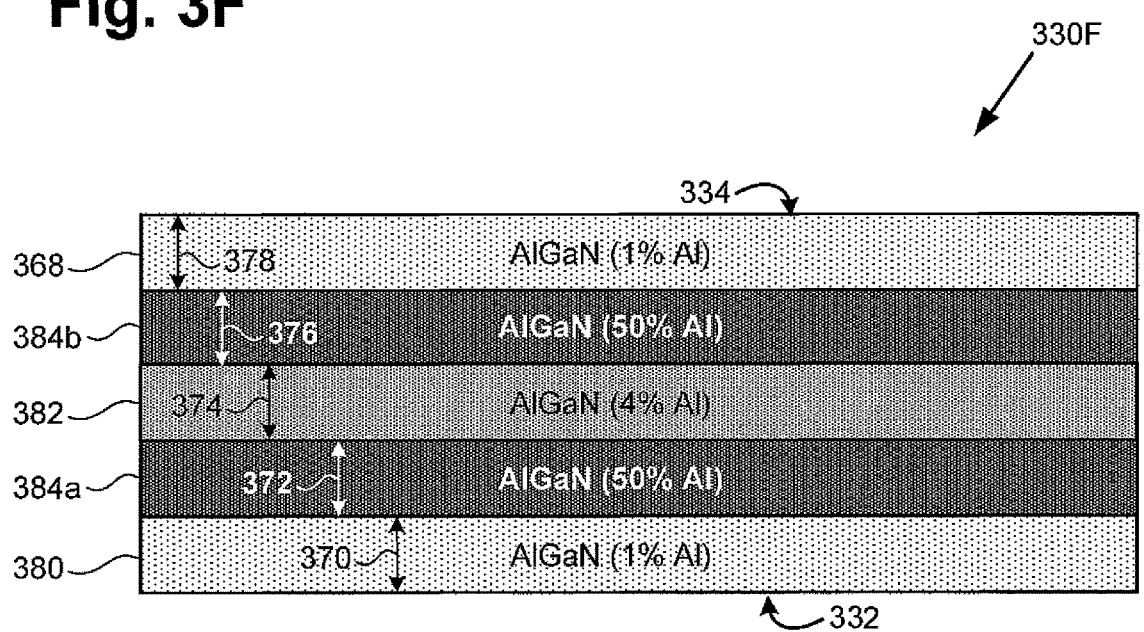
FIG. 3F shows a cross-sectional view of an exemplary back barrier suitable for use in the III-Nitride bidirectional devices of FIG. 1 and FIG. 2, according to another implementation.

Moving to FIG. 3F, FIG. 3F shows a cross-sectional view of an exemplary back barrier suitable for use in the III-Nitride bidirectional devices of FIGS. 1 and 2, according to another implementation. It is noted that the features in FIG. 3F identified by reference numbers identical to those appearing in FIGS. 3A and 3C correspond respectively to those features, as described above, and may share any of the characteristics attributed to those corresponding features, above. It is further noted that back barrier 330F having bottom surface 332 and top surface 334 corresponds in general to back barrier 130/230 having bottom surface 132/232 and top surface 134/234 in FIG. 1/2, and may share any of the characteristics attributed to that corresponding feature in the present application.

As shown in FIG. 3F, back barrier 330F has multiple interior layers having a highest aluminum concentration (i.e., approximately 50% Al interior layers 384a and 384b). It is noted that although FIG. 3F shows back barrier 330F as including five exemplary layers, two of which share a highest aluminum concentration, more generally, back barrier 130/230 may have any number of layers. For example, back barrier 130/230 may include a superlattice of III-Nitride layers having multiple peak aluminum concentrations between bottom layer 380 and top layer 368.

It is further noted that although back barrier 330F is shown as a stack of discrete layers, in other implementations, back barrier 330F may be implemented as a graded III-Nitride layer having an alloy distribution corresponding to that shown in FIG. 3F. Moreover, the distribution of III-Nitride alloys in back barrier 330F may form a Gaussian style symmetric distribution, or a smooth or piecewise-continuous asymmetric distribution between the alloy used to form bottom layer 380 and the alloy used to form top layer 368.

Figure 4A:
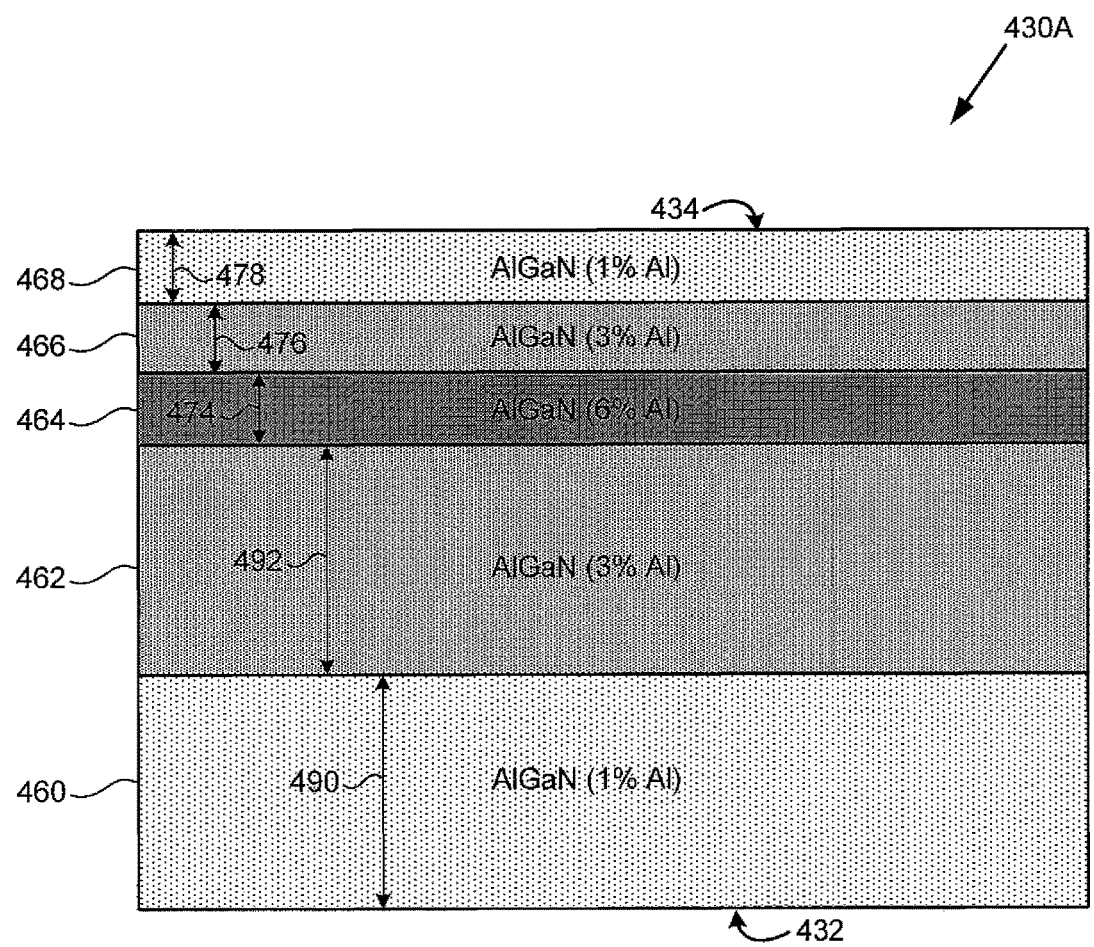
FIG. 4A shows a cross-sectional view of an exemplary back barrier suitable for use in the III-Nitride bidirectional devices of FIG. 1 and FIG. 2, according to yet another implementation.

Referring now to FIG. 4A, FIG. 4A shows a cross-sectional view of an exemplary back barrier suitable for use in the III-Nitride bidirectional devices of FIGS. 1 and 2, according to yet another implementation. As shown in FIG. 4A, back barrier 430A includes multiple III-Nitride layers in the form of AlGaN layers including bottom layer 460 having thickness 490, layer 462 having thickness 492, middle layer 464 having thickness 474, layer 466 having thickness 476, and top layer 468 having thickness 478. As further shown in FIG. 4A, back barrier 430A has bottom surface 432 provided by bottom layer 460, and top surface 434 provided by top layer 468. Back barrier 430A having bottom surface 432 and top surface 434 corresponds in general to back barrier 130/230 having bottom surface 132/232 and top surface 134/234 in FIG. 1/2, and may share any of the characteristics attributed to that corresponding feature in the present application.

According to the implementation shown in FIG. 4A, adjoining layers of back barrier 430A have different respective aluminum concentrations. Moreover, thicknesses 490 and 492 are shown to be substantially greater than thicknesses 474, 476, and 478. For example, thickness 490 of bottom layer 460 may be up to approximately five times greater, or more, than thickness 478 of top layer 468. Furthermore, according to the present implementation, the aluminum concentration at top surface 434 (i.e., approximately 1%) is substantially equal to the aluminum concentration at bottom surface 432 (i.e., approximately 1%).

Middle layer 464 of back barrier 430A is shown to have the highest aluminum concentration (i.e., approximately 6%) among III-Nitride layers 460, 462, 464, 466, and 468. Moreover the aluminum concentration of back barrier 430A is shown to be stepped up between bottom layer 460 and middle layer 464 by layer 462 (approximately 3% Al), and to be correspondingly stepped down between middle layer 464 and top layer 468 by layer 466 (approximately 3% Al).

It is noted that although back barrier 430A is shown as a stack of discrete layers, which may form a superlattice, for example, in other implementations, back barrier 430A may be implemented as a graded III-Nitride layer having an alloy distribution corresponding to that shown in FIG. 4A. Furthermore, the distribution of III-Nitride alloys in back barrier 430A may form a smooth or piecewise-continuous asymmetric distribution between the alloy used to form bottom layer 460 and the alloy used to form top layer 468.

Figure 4B:
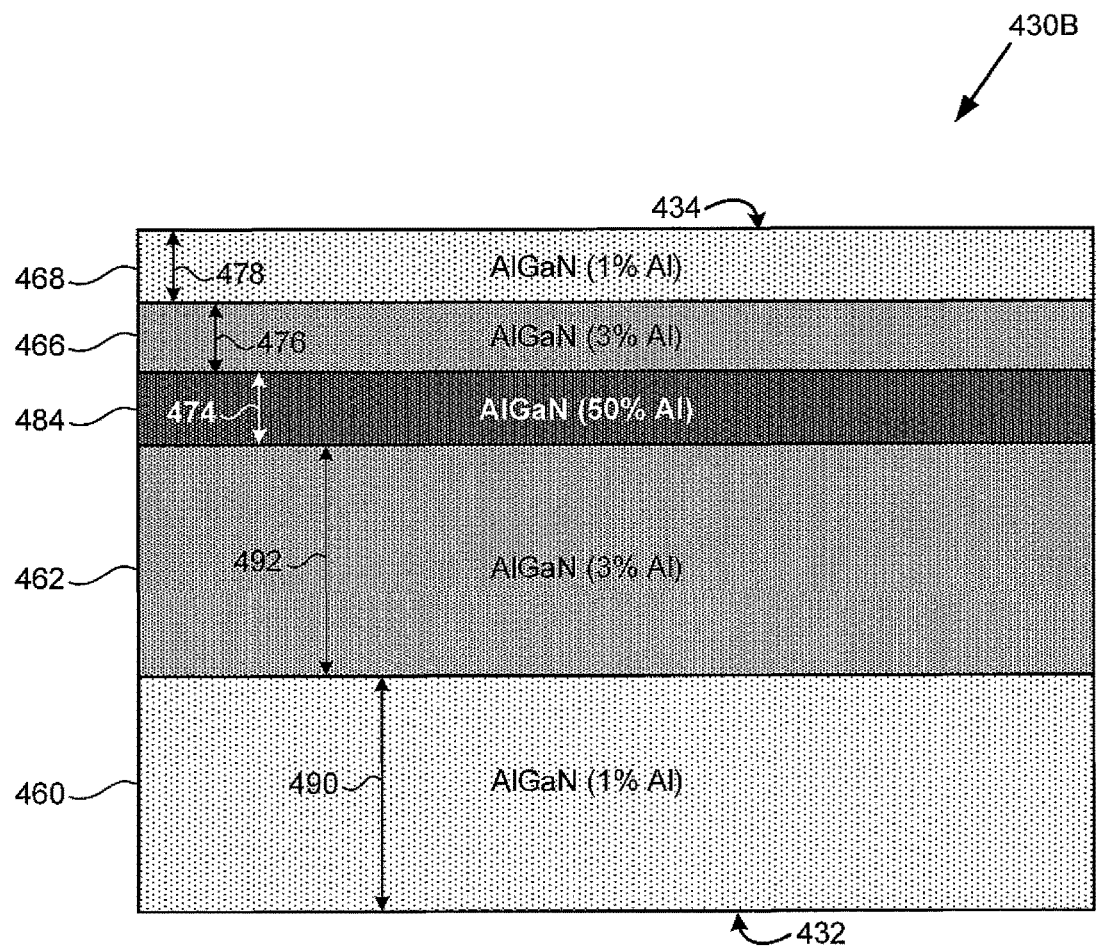
FIG. 4B shows a cross-sectional view of an exemplary back barrier suitable for use in the III-Nitride bidirectional devices of FIG. 1 and FIG. 2, according to another implementation.

Continuing to FIG. 4B, FIG. 4B shows a cross-sectional view of an exemplary back barrier suitable for use in the III-Nitride bidirectional devices of FIGS. 1 and 2, according to another implementation. It is noted that the features in FIG. 4B identified by reference numbers identical to those appearing in FIG. 4A correspond respectively to those features, as described above, and may share any of the characteristics attributed to those corresponding features, above. It is further noted that back barrier 430B having bottom surface 432 and top surface 434 corresponds in general to back barrier 130/230 having bottom surface 132/232 and top surface 134/234 in FIG. 1/2, and may share any of the characteristics attributed to that corresponding feature in the present application.

As shown in FIG. 4B, back barrier 430B differs from back barrier 430A, in FIG. 4A, in that the implementation in FIG. 4B includes middle layer 484 having a substantially higher aluminum concentration (i.e., approximately 50%) than middle layer 464. It is noted that although back barrier 430B is shown as a stack of discrete layers, which may form a superlattice, for example, in other implementations, back barrier 430B may be implemented as a graded III-Nitride layer having an alloy distribution corresponding to that shown in FIG. 4B. Moreover, the distribution of III-Nitride alloys in back barrier 430B may form a smooth or piecewise-continuous asymmetric distribution between the alloy used to form bottom layer 460 and the alloy used to form top layer 468.

Figure 4C:
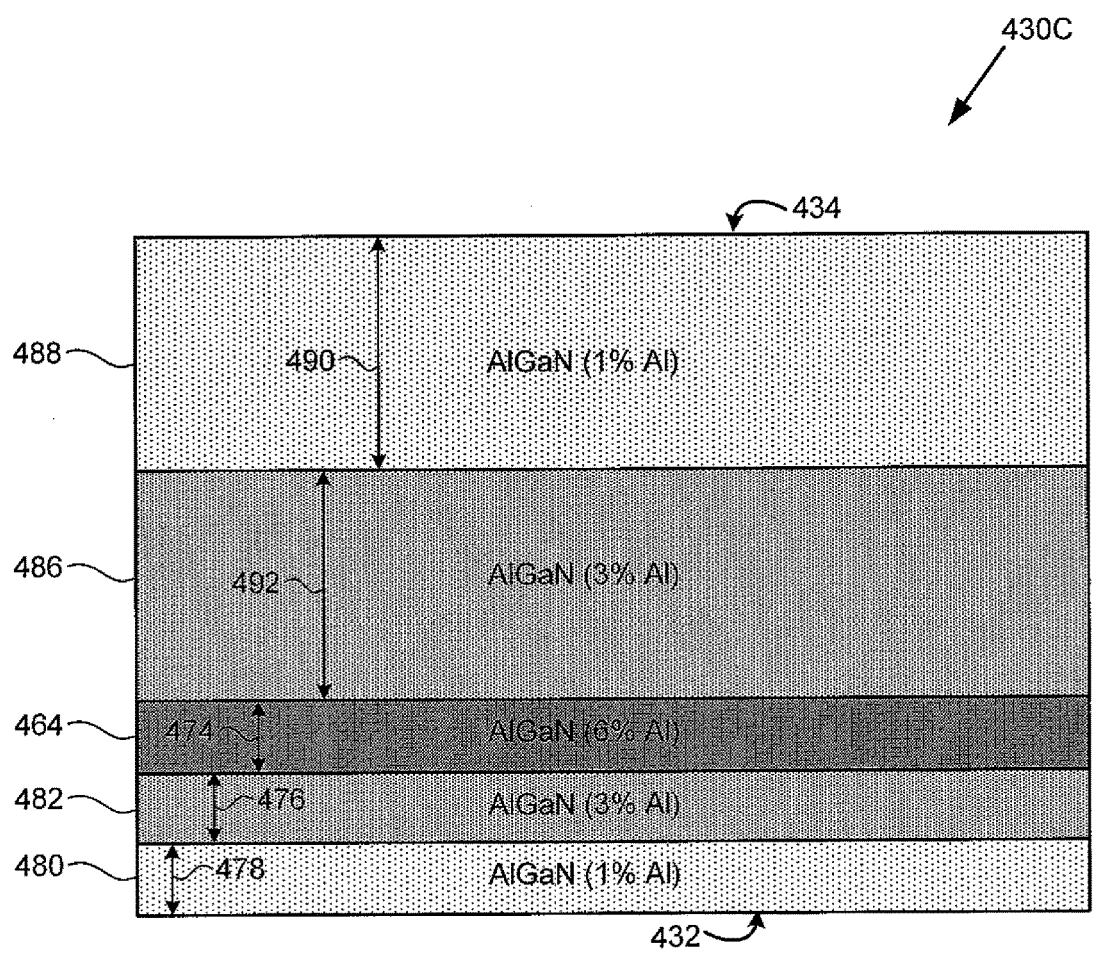
FIG. 4C shows a cross-sectional view of an exemplary back barrier suitable for use in the III-Nitride bidirectional devices of FIG. 1 and FIG. 2, according to another implementation.

Referring to FIG. 4C, FIG. 4C shows a cross-sectional view of an exemplary back barrier suitable for use in the III-Nitride bidirectional devices of FIGS. 1 and 2, according to another implementation. It is noted that the features in FIG. 4C identified by reference numbers identical to those appearing in FIG. 4A correspond respectively to those features, as described above, and may share any of the characteristics attributed to those corresponding features, above. It is further noted that back barrier 430C having bottom surface 432 and top surface 434 corresponds in general to back barrier 130/230 having bottom surface 132/232 and top surface 134/234 in FIG. 1/2, and may share any of the characteristics attributed to that corresponding feature in the present application.

As shown in FIG. 4C, back barrier 430C differs from back barriers 430A and 430B, in FIGS. 4A and 4B, in that bottom layer 480 has thickness 478 that is substantially less than thickness 490 of top layer 488. It is noted that although back barrier 430C is shown as a stack of discrete layers, which may form a superlattice, for example, in other implementations, back barrier 430C may be implemented as a graded III-Nitride layer having an alloy distribution corresponding to that shown in FIG. 4C. Moreover, the distribution of III-Nitride alloys in back barrier 430C may form a smooth or piecewise-continuous asymmetric distribution between the alloy used to form bottom layer 480 and the alloy used to form top layer 488.

Thus, the present application discloses III-Nitride bidirectional devices configured such that the disadvantages associated with current leakage during the off-state in some conventional device structures are reduced or substantially eliminated. According to the exemplary implementations disclosed in the present application, a back channel layer of a III-Nitride bidirectional device is configured to have a polarization substantially equal to a polarization of a device channel layer, thereby reducing or substantially eliminating leakage current between the transistor gates. As a result, large power losses due to leakage current when such a bidirectional device is in the off-state can be advantageously avoided.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A III-Nitride bidirectional device comprising:
a substrate;
a back channel layer situated over said substrate;
a device channel layer and a device barrier layer situated over said back channel layer, said device channel layer and said device barrier layer configured to produce a device two-dimensional electron gas (2DEG);
first and second gates formed on respective first and second depletion segments situated over said device barrier layer;
a back barrier situated between said back channel layer and said device channel layer;
wherein a polarization of said back channel layer is substantially equal to a polarization of said device channel layer,
wherein said first and second depletion segments are configured to deplete said 2DEG under said first and second gates so that said 2DEG is interrupted under said first and second gates.

2. The III-Nitride bidirectional device of claim 1, wherein said III-Nitride bidirectional device is an enhancement mode, normally off bidirectional transistor.

3. The III-Nitride bidirectional device of claim 1, wherein said first and second gates make ohmic contact with said respective first and second depletion segments.

4. The III-Nitride bidirectional device of claim 1, wherein said first and second gates make Schottky contact with said respective first and second depletion segments.

5. The III-Nitride bidirectional device of claim 1, wherein said back barrier produces at least one of a back 2DEG in said back channel layer and a two-dimensional hole gas (2DHG) in said device channel layer, and wherein said back 2DEG is uninterrupted under said first and second gates.

6. The III-Nitride bidirectional device of claim 1, wherein an aluminum concentration at a top surface of said back barrier is substantially equal to an aluminum concentration at a bottom surface of said back barrier.

7. The group III-V bidirectional device of claim 1, wherein an aluminum concentration at a top surface of said back barrier is less than or greater than an aluminum concentration at a bottom surface of said back barrier.

8. The group III-V bidirectional device of claim 1, wherein said back barrier comprises a plurality of III-Nitride layers, and wherein adjoining layers of said back barrier have different respective aluminum concentrations.

9. The group III-V bidirectional device of claim 8, wherein a bottom layer of said plurality of III-Nitride layers has a thickness substantially greater than or substantially less than a top layer of said plurality of III-Nitride layers.

10. The group III-V bidirectional device of claim 1, wherein said first and second depletion segments comprise P type GaN.

11. A III-Nitride bidirectional device comprising:
a substrate;
a gallium nitride (GaN) back channel layer situated over said substrate;
a GaN device channel layer and an AlGaN device barrier layer situated over said GaN back channel layer, said GaN device channel layer and said AlGaN device barrier layer configured to produce a device two-dimensional electron gas (2DEG);
first and second gates formed on respective first and second depletion segments situated over said AlGaN device barrier layer;
an AlGaN back barrier situated between said GaN back channel layer and said GaN device channel layer;
wherein a polarization of said GaN back channel layer is substantially equal to a polarization of said GaN device channel layer,
wherein said first and second depletion segments are configured to deplete said 2DEG under said first and second gates so that said 2DEG is interrupted under said first and second gates.

12. The III-Nitride bidirectional device of claim 11, wherein said III-Nitride bidirectional device is an enhancement mode, normally off bidirectional transistor.

13. The III-Nitride bidirectional device of claim 11, wherein said first and second gates make ohmic contact with said respective first and second depletion segments.

14. The III-Nitride bidirectional device of claim 11, wherein said first and second gates make Schottky contact with said respective first and second depletion segments.

15. The III-Nitride bidirectional device of claim 11, wherein said AlGaN back barrier produces at least one of a back 2DEG in said GaN back channel layer and a two-dimensional hole gas (2DHG) in said GaN device channel layer, and wherein said back 2DEG is uninterrupted under said first and second gates.

16. The III-Nitride bidirectional device of claim 11, wherein each of said GaN back channel layer and said GaN device channel layer comprises aluminum, an aluminum concentration of said GaN back channel layer being substantially equal to an aluminum concentration of said GaN device channel layer.

17. The III-Nitride bidirectional device of claim 11, wherein an aluminum concentration at a top surface of said AlGaN back barrier is substantially equal to an aluminum concentration at a bottom surface of said AlGaN back barrier.

18. The group III-V bidirectional device of claim 11, wherein an aluminum concentration at a top surface of said AlGaN back barrier is less than or greater than an aluminum concentration at a bottom surface of said AlGaN back barrier.

19. The group III-V bidirectional device of claim 11, wherein said AlGaN back barrier comprises a plurality of AlGaN layers, and wherein adjoining layers of said AlGaN back barrier have different respective aluminum concentrations.

20. The group III-V bidirectional device of claim 19, wherein at least one interior layer of said AlGaN back barrier has a highest aluminum concentration among said plurality of AlGaN layers.

21. The group III-V bidirectional device of claim 19, wherein a bottom layer of said plurality of AlGaN layers has a thickness substantially greater than or substantially less than a top layer of said plurality of AlGaN layers.

22. The III-Nitride bidirectional device of claim 11, wherein said first and second depletion segments comprise P type GaN.

* * * * *